United States Patent [19]

Pastor

[11] 4,110,080

[45] Aug. 29, 1978

[54] REACTIVE ATMOSPHERIC PROCESSING CRYSTAL GROWTH APPARATUS

[75] Inventor: Antonio C. Pastor, Santa Monica, Calif.

[73] Assignee: Hughes Aircraft Company, Culver City, Calif.

[21] Appl. No.: 743,263

[22] Filed: Nov. 19, 1976

[51] Int. Cl.² .............................................. B01J 17/20
[52] U.S. Cl. ........................... 23/273 SP; 156/616 R; 156/DIG. 83; 156/DIG. 89; 156/617
[58] Field of Search .................. 156/616 A, DIG. 90, 156/616 R, DIG. 83, DIG. 89, 617 V; 23/273 SP

[56] References Cited

U.S. PATENT DOCUMENTS 3,139,653  7/1964  Orem ..................................... 156/616
3,591,340  7/1971  Plaskett ............................ 156/616 A

OTHER PUBLICATIONS

Jensen, The Rev. of Sci. Instra., vol. 42, No. 10, Oct. 1971, pp. 1407–1409.
Fischer. J. of Electrochem. Soc., Feb. 1970, pp. 41C to 47C, vol. 117, No. 2.
Calawa, Trans. of the Metallurgical Soc. of AIME, vol. 242, Mar. 1968, pp. 374 to 383.
Turnbull, J. of Chem. Physics, vol. 18, No. 2, Feb. 1950, pp. 198 to 203.
Lawson, Preparation of Single Crystals, London, 1958, pp. 12–18, 38–41, 184–187.

Primary Examiner—Stephen J. Emery
Attorney, Agent, or Firm—Booker T. Hogan, Jr.; W. H. MacAllister

[57] ABSTRACT

A crucible adapted for receiving crystal growth starting materials and exposing them to a reactive atmosphere under a carefully controlled temperature environment is disclosed.

4 Claims, 3 Drawing Figures

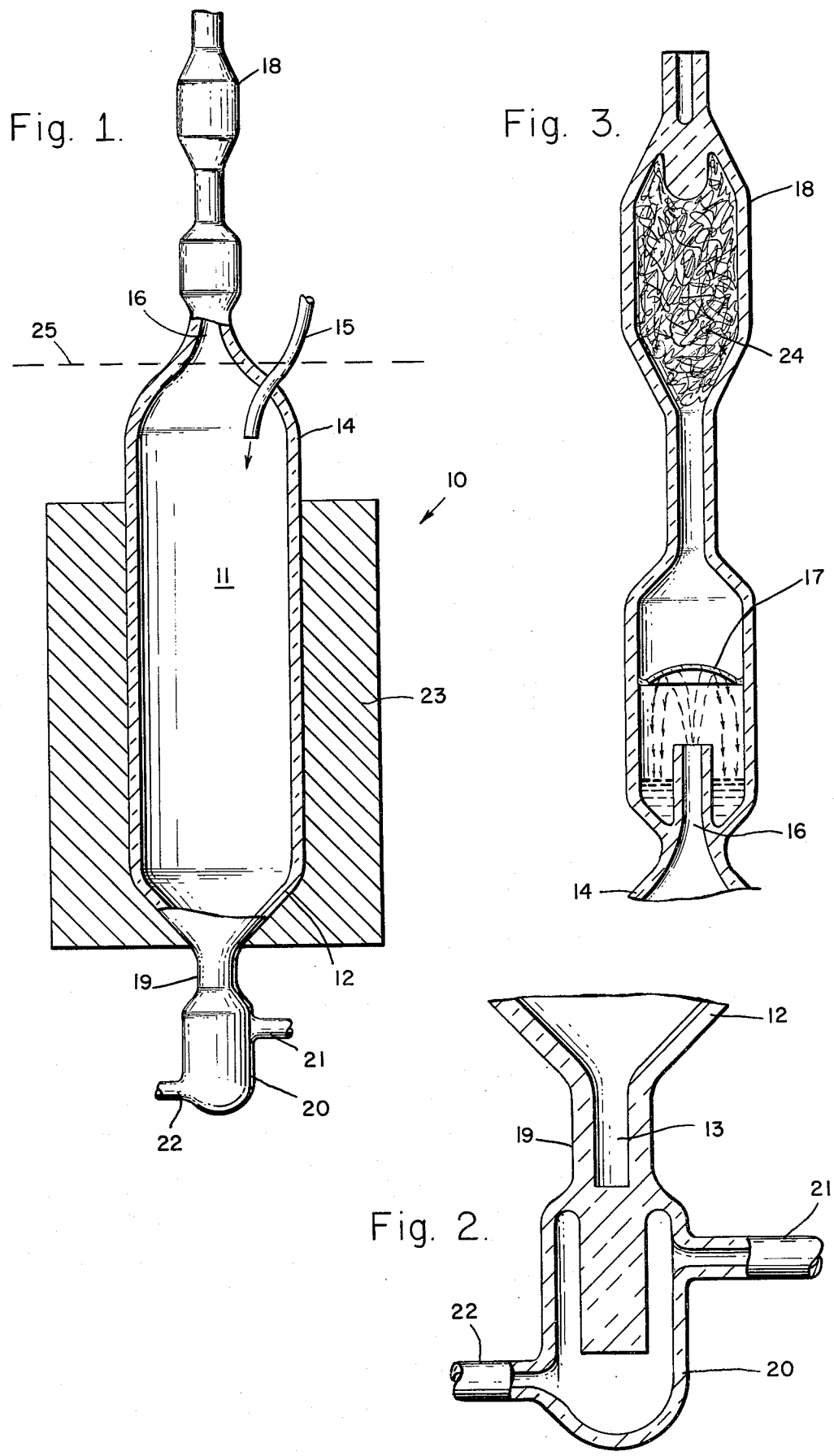

REACTIVE ATMOSPHERIC PROCESSING CRYSTAL GROWTH APPARATUS

RELATED APPLICATION

Application Ser. No. 645,866 filed Dec. 29, 1975 by Pastor and Pastor discloses a process for growing Alkali Metal Halides under Reactive Atmospheric Conditions and Application Ser. No. 645,151 filed December 30, 1975 by Pastor and Pastor discloses a process for growing alkaline earth metal halides under RAP conditions. The present application is related to application Ser. Nos. 645,151 and 645,866 in that the growth process disclosed in each of the prior filed applications is carried out in crucibles fabricated per the present invention.

Application PD-72054 filed herewith by Applicant herein discloses an improved crystal growth process which utilizes a species of the invention herein described.

Hughes Aircraft Company, a corporation incorporated under the laws of the State of Delaware with its principal place of business located in Culver City, CA, is the common assignee of the instant invention and of each of the inventions of the related applications.

BACKGROUND OF THE INVENTION

1. Field of the Invention

This invention is directed generally to an apparatus for growing large single crystals of metal halides and chalcogenides, in a controlled environment in general and more particularly to the fabrication of a crystal growth apparatus for use in the growth of large single crystals in a controlled environment of a specific character.

2. Prior Art

Crystal growth crucibles employed in prior art crystal growth from the melt processes may be characterized as opened or closed end. These devices are especially fabricated by individual researchers from vitreous silica, or graphite materials which are readily available in most laboratories. There are no commercial suppliers of crystal growth crucibles known to Applicant. Examples of prior art crucibles employed in prior art crystal growth processes are those employed by Bridgman, Stockbarger, Czochralski and their various modifications by Dillon, Davey, Quimby, Kapitza, Gompery and Nacken (see "Crystal Growth" by H. E. Buckley, pp. 71 et seq, published by John Wiley & Sons, Inc.).

Prior art crystal growth crucibles were not suitable for crystal growth under a reactive atmosphere or other controlled atmospheric condition because of the propensity of these crucibles for reacting with the corrosive gases of the reactive atmosphere.

The necessity of controlling the growth environment may be understood when one takes into consideration the effect of trace impurities and/or contaminants on the ability to produce large optically pure single crystals and the stability of such crystals when employed in high power laser applications.

In the well known and popular Bridgman-Stockbarger method, the melt and the heating element "see" the same atmosphere. Therefore, both the melt and the heating element must be chemically compatible with their common atmosphere, so that this atmosphere will not serve as a chemical bridge for mass exchange between the melt and the heater. Otherwise, problems of contamination and/or heater stability will set in.

Chemical compatibility between the melt, the container structural materials and the heating elements of the furnace is a severe constraint in the production of large ultra pure single crystals. Since the spectrum of choices of heating elements available in the market is narrow, the freedom of choice of crystal material is limited. The need for precise temperature control during the growth process has long been recognized by those skilled in the art. For example, the Bridgman method, as improved upon by Stockbarger, utilizes dual furnaces separated by a platinum baffle to create sharp thermal gradients as the crucible is lowered during the crystal grown process. However, it can be shown that the sharp thermal gradient, obtained by this process, exist only at the interior surface of the furnace. The temperature profile along the axis of the charge material is quite different, unless the charge material is an excellent thermal conductor, whether it is frozen or melted.

Heat losses due to radiation continue to predominate in Bridgman-Stockbarger growth methods. Concave upward isotherms are formed as a result of the flow of heat towards the sides of the crucible. Since crystal growth takes place at the interface of the isotherm at the melting point ($T_{mp}$), the crystal will grow along a concave upward surface. This phenomena tends to yield less perfect crystals because of stress inducement.

THE INVENTION

SUMMARY OF THE INVENTION

In seeking to avoid the limitations and disadvantages of the above stated prior art crystal growth crucibles, an apparatus suitable for use in growing large single crystals of alkali metal halides, alkali metal chalcogenides, and alkaline earth metal halides under a controlled reactive atmosphere has been invented.

The crucible embodying the invention is fabricated from viterous silica or other inert low porosity materials, Kaowool felt and teflon or tygon materials. It is comprised essentially of an elongated tubular or rectangular ampoule, having an inlet for the introduction of reactive gases into the ampoule and an outlet, containing two traps, for releasing effluent gases, on its top. A means for introducing and circulating a coolant is provided at the bottom of the ampoule and an insulation jacket or blanket of Kaowool felt is provided about the periphery of the ampoule.

The invention has as an objective, the provision of a container for the starting materials employed in the growth of large single crystals under closely controlled environmental conditions. This container or crucible must be capable of withstanding corrosive chamical activities at elevated temperatures, provide for the creation of a dynamic atmosphere and be susceptible to precise temperature controls.

Another objective of the invention is to provide a low cost crucible for use in the growth of large single halide crystals under reactive atmospheric conditions.

A still further objective of the invention is the provision of a crucible design suitable for scaling up to produce very large single crystals of alkali metal and alkaline earth metal halides.

This invention provides for a complete separation of charge and furnace atmospheres which prevents contamination and furnace instabilities. In addition the invention facilitates the use of a Reactive Atmosphere Process (RAP) during crystal growth.

The RAP process accomplishes two objectives (that of material purification and that of crystal growth) simultaneously and therefore cooperatively. While some of the advantages of this cooperative action are known, the total synergistic effects of RAP crystal growth can only be empirically determined and are believed to be substantial.

A second advantage of the invention is in its ability to effect a flattening of the crystal growth interface. This leads to the achievement of uniformity, homogeneity and integrity in the resulting crystals. This phenomenon is achieved by the judicious use of insulation materials about the exterior surface of the crucible itself and the provision of a heat sink at the bottom of the crucible to direct the flow of heat.

A third advantage of this crucible design lies in the ability to provide for quasi-steady state growth even during the flaring out phase of growth immediately following nucleation or seeding. This is achieved in two ways. First since the cross-section of the vested workpiece is constant, radiation loss, besides being reduced due to the presence of the insulation, becomes constant. Second, the insulation material is soft and pliable; therefore, it can be brought to dimensions very close to the internal dimensions of the furnace, and thus eliminate all possibilities of convection in the furnace. This tends to ensure a sharp thermal gradient within the furnace because convection serves to reduce thermal gradients.

BRIEF DESCRIPTION OF THE DRAWINGS

FIG. 1 presents an overall cross-sectional view of the invention.

FIG. 2 is a detailed cross-sectional view of the lower portion or stem of the invention showing the nucleating tip of the crucible and provisions for the cooling of the nucleating end of the crucible.

FIG. 3 is a detailed cross-sectional view of the upper portion of the invention which shows features which facilitate a continuous flow of gases through the crucible at predetermined rates.

DETAILED DESCRIPTION OF THE INVENTION

A better appreciation of the simplicity of this invention and how it tends to operate in a novel and unexpected manner to yield ultra pure large metal halide and chalcogenide single crystals may be realized upon reference to FIG. 1 in which a cross-sectional view of the apparatus embodying the invention 10 is shown. For the growth of alkali metal halide crystals, vitreous silica has been found to be a preferred material for use in the construction of the crucible 10. This material is commercially available in the form of tubes and rods of various shapes. Conventional glass blowing techniques are used to fabricate this crucible.

Other materials such as vitreous or pyrolytic carbon and hi-strength, low-porosity, hi-purity graphite may be used. However, the cost differential between that of these materials and vitreous silica tends to place the latter in a preferred position.

The crucible can be described as having elements or design features which act in concert to facilitate the growth of a superior single crystal. Crystal growth takes place in an ampoule or main chamber 11 having a tapered bottom 12 which terminates in a capillary stem 13. The upper portion 14 of the ampoule contains an inlet means 15 for introducing gaseous agents into the ampoule and an outlet means 16 for removing effluent gases. In order to preclude the return of liquid reflux into the main chamber and undesirable pressure build-ups, the outlet means 16 is fitted with a first trap 17 for liquid condensates. A second trap 18 for sublimated solids is placed in series with the first trap 17 on the outlet means 16. This second trap is needed to preclude clogging of the downstream plumbing (not shown) thereby interrupting the steady state flow of the inlet and outlet gases. At the lower end of the crucible bottom 12 surrounding the capillary stem 13 is a heat sink 19 abutted to a coolant jacket 20 having a coolant inlet 21 and coolant outlet 22. This feature acts in concert with an insulation sleeve 23. wrapped about the preferia of the ampoule 11 intermediate its ends, to make the direction of heat flow longitudinal. A longitudinal heat flow pattern, and the subsequent growth of the crystal along a single longitudinal plane, is essential to homogeneity and integrity of the crystal.

The combination of the heat flow control elements 19, 20 and 23 with the gaseous inlet and outlet elements 15, 16 17 and 18 provide the superior crystal growth characteristics of this crucible which distinguish it from prior art crystal growth methods such as that invented by Bridgman and Stockbarger's modification of it.

An expanded view of the heat sink 19 and the coolant jacket 20 is shown in FIG. 2. These elements are fabricated from the same material used to fabricate the main crystal growth ampoule. Other cooling configurations may be employed so long as a suitable thermal differential for creating and maintaining a constant heat sink is provided. Vitreous silica or quartz materials tend to exhibit good heat flow characteristics in addition to excellent chemical resistance to corrosive materials.

In addition to heat flow control elements 19 and 20, the crucible is provided with a thermal insulation jacket, blanket or sleeve 23 to ensure a uniform rate of heat loss during the crytal pulling or growth phase of the process when the crucible is separated from the heat input means (not shown).

This jacket is designed to fit closely about the periphery of the ampoule 11 and extend in a radial direction from the center of the ampoule to the very edge of the heat source or furnace used to cause the starting materials to become molten. Generally, it is desirable to cause the diameter of the ampoule including that of its insulation to be twice that of the uninsulated ampoule or crucible.

While the design of the furnace or heat source is not a subject of this invention, it is convenient at this point to note that the best results are obtained when a furnace is selected such that its inside diameter very closely approaches twice the diameter of the crystal growth crucible.

The above-stated criteria leads to the reduction, if not the complete elimination, of thermal convections which result in varying thermal gradients throughout the molten material or melt.

In addition to its use to reduce or eliminate thermal convections about the surface of the crucible, the insulation jacket 23 serves to direct the flow of heat along the crucible axis to the heat sink 19 during the "pulling" or crystal growth phase of the process. This feature of this invention further distinguishes it from prior art crucibles which do not have, as an integral part of their design, an external thermal insulation blanket or sleeve. The results of the failure to provide such insulation is the creation of heat flow lines which start axially and curve toward the sides of the crucible because of radiation losses.

Radiation losses during the "pulling" phase of a crystal growth process using this invention are minimized by the external insulation 23. Therefore, the heat flow patterns are essentially longitudinal because of the heat sink 19 at the bottom end of the crucible.

A high purity alumina silica fine clay material, sold under the trade name Kaowool felt by Babcock & Wilcox Co. of Los Angeles, CA, has been used extensively as the thermal insulator 23 because of its flexibility and excellent thermal characteristics. However, other known pliable insulation materials may also be used.

This invention was designed for use primarily in the preparation of large single crystals by a RAP crystal growth process. This process is facilitated by the design features shown in FIG. 3. The key to a successful RAP process is the ability to create and maintain a steady state dynamic atmosphere of a specific character above the crystal growth surface-melt interface.

These conditions are met by providing the liquid condensate trap 17 and the sublimated solid trap 18 on the effluent gas outlet 16.

The liquid condensate trap 17 serves to preclude the return of reflux liquids into the crytal growth chamber during the crystal growth process. This is very important in that such a return of cooler liquids into a region of elevated temperature would result in chamber pressure buildups which tend to interfere with the flow of RAP gases which alters their stoichiometric composition and, also has the propensity for leading to the rupture of the chamber.

The solid trap 18 is also needed to ensure a steady state dynamic atmospheric condition. Invariably, effluent gases, upon cooling, deposit sublimated solids upon the cooled surfaces. These solids if not entrapped by the quartz wool (pure fused quartz fibers of $\simeq 6\mu$ in diameter) 24 used to fill the solid trap 18 will eventually result in the partial blockage or complete clogging of the downstream plumbing (not shown) used to convey the effluent gases from the crystal growth ampoule. Such an occurrence, like that of returning reflux liquids to the chamber, leads to an alteration in the steady state flow patterns of the dynamic RAP atmosphere and a subsequent alteration of the stoichiometric character of its composition. While quartz wool has been used exclusively as the packing medium 24 for the solid trap 18 other high surface area materials may be used if they are chemically inert with respect to the effluent gas.

In operation, a prefabricated crucible, opened near the top along a plane marke 25, is charged with the starting material (if a crystal having specific structural) characteristics is desired, a seeding crystal having the desired characteristics may be placed into the stem 13 prior to charging the crucible. Seed crystals are not required for all crystal growth from the melt operations however. Crystal growth in the absence of a seed crystal is initiated spontaneously by the decrease in temperature of the melt caused by the introduction of a coolant into the coolant jacket 20 which lowers the temperature of the heat sink 19.).

The charged crucible is then sealed or welded to the outlet means 16 by conventional glass blowing techniques. After sealing the charged crucible, a crystal growth process may be initiated by connecting the crucible to a RAP source gas inlet (not shown), downstream plumbing for the removal of effluent gases, and placing it into a furnace having vertical heating elements baffled against convection and with the capacity for raising the temperature of the crucible and its contents above the melting point of its contents.

Tygon or teflon tubing material may be used for the gas inlet and downstream plumbing. The determining factor here is the selection of a chemically inert material capable of resisting the corrosive action of the RAP gas and process effluent. Therefore, other materials which meet these requirements will work as well as tygon and telfon.

The temperature of the furnace is raised as needed to render the starting charge molten and a RAP source gas is introduced into the crucible through the inlet 15.

A constant flow rate RAP gas through the crucible is created and maintained for an extended period at the temperature of the molten material. During this period, the molten starting charge is purified and the interior walls of the crucible are baked and scrubbed of contaminants.

Actual crystal growth begins when a coolant is introduced into the coolant jacket 20 which lowers the temperature of the heat sink 19 and causes the temperature of the melt in the stem 13 to drop below its melting point.

Crystal growth is maintained by either lowering the crucible to remove it from the furnace or raising the furnace.

The dynamic RAP atmosphere is maintained throughout the growth process and crystal cool-down phase.

The crucible of this invention may be adapted to prepare large flat single crystals having a major and a minor axis, large cylindrical single crystals or large crystals of any configuration. This is facilitated by the operator's choice of crucible material, geometry and volumetric configurations. The use of a flexible pliable insulation material 23 contributes to the flexibility of crystal configurations. A limiting factor will be in the acquisition of a furnace to closely conform to the external dimensions of the crucible.

If one chooses to perform a crystal growth operation under vacuum instead of performing the RAP crystal growth process, the crucible may be adapted for vacuum use by sealing either the inlet or outlet means and attaching the unsealed means to a vacuum source.

A major advantage of this crystal growth configuration lies in the lack of necessity for manual material manipulations or handling between charging the crucible and the removal of the grown crystal from the crucible. This feature tends to significantly reduce the cost of large single crystals by the reduction of man hours required to produce the crystals and it improves the quality of the crystal by eliminating possible sources of contamination and stress inducement during the crystal growth process.

Having fully disclosed my invention, how to make it and how to use it, the scope of my claims may now be understood to be:

What is claimed is:

1. Crystal growth apparatus comprising:
    an ampoule having a vertically elongated wall defining a chamber for receiving a crystal growth source material wherein said chamber converges at its lower end to form a seeding cavity at its bottom characterized by a conical first section and a capillary second lower section;
    said wall being integrally joined at the bottom end to a heat sink having an inlet and an outlet means adapted for receiving a coolant and being integrally joined at the upper end to a passageway for introducing gases and a passageway for removing gases from said chamber; said passageway for removing gases including first and second series connected traps of a diameter larger than the portions of said passageway leading to, from and interconnecting same, whereby liquid and solid condensates are precluded from re-entering said chamber; and insulation means surrounding said wall intermediate said ends adapted for controlling heat losses occasioned by convection and radiation upon the removal of said crucible from within a furnace during a crystal growth operation.

2. The apparatus of claim 1 wherein said lower end terminates with a capillary stem immediately prior to said connection with said heat sink and wherein said chamber has a cylindrical cross section.

3. The apparatus of claim 1 wherein said chamber has a rectangular cross section suitable for yielding a monocrystalline material having a major and minor axis.

4. The apparatus defined in claim 1 wherein said wall and said heat sink join to define the capillary lower end of said chamber for receiving a seed crystal whereby the crystallographic orientation of the grown crystal may be matched to that of a seed crystal as crystal growth is initiated in the vicinity of said seed crystal.

* * * * *